(12) United States Patent
Ludwig et al.

(10) Patent No.: US 7,336,064 B2
(45) Date of Patent: Feb. 26, 2008

(54) APPARATUS FOR CURRENT MEASUREMENT

(75) Inventors: Klaus Ludwig, Erlangen (DE); Gotthard Rieger, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/085,153

(22) Filed: Mar. 22, 2005

(65) Prior Publication Data
US 2005/0218882 A1 Oct. 6, 2005

(30) Foreign Application Priority Data
Mar. 23, 2004 (DE) .................. 10 2004 014 212
Dec. 23, 2004 (DE) .................. 10 2004 062 474

(51) Int. Cl.
*G01R 33/09* (2006.01)
*H01L 43/00* (2006.01)
(52) U.S. Cl. ............................. 324/117 R; 338/32 R
(58) Field of Classification Search .................. None
See application file for complete search history.

(56) References Cited

U.S. PATENT DOCUMENTS

| | | | | |
|---|---|---|---|---|
| 2,946,955 | A | * | 7/1960 | Kuhrt .................. 324/101 |
| 3,109,985 | A | * | 11/1963 | Kallmann .................. 323/368 |
| 3,928,836 | A | * | 12/1975 | Makino et al. .............. 338/22 R |
| 5,699,214 | A | * | 12/1997 | Kano et al. .................. 360/324 |
| 5,708,407 | A | * | 1/1998 | Mouchot et al. .......... 338/32 R |
| 5,759,434 | A | * | 6/1998 | Shimakawa et al. .. 252/62.51 R |
| 6,667,682 | B2 * | | 12/2003 | Wan et al. .................. 338/32 R |
| 6,781,359 | B2 * | | 8/2004 | Stauth et al. .............. 324/117 H |
| 6,913,818 | B2 * | | 7/2005 | Matsubaguchi et al. .... 428/323 |
| 2005/0077890 | A1 * | | 4/2005 | Rannow et al. ......... 324/117 R |

FOREIGN PATENT DOCUMENTS

| | | |
|---|---|---|
| DE | 39 29 452 A1 | 3/1991 |
| DE | 43 10 318 C2 | 12/1998 |
| DE | 101 03 398 A1 | 8/2002 |
| JP | 2001-345496 A | 12/2001 |
| WO | WO 95/09447 A | 4/1995 |
| WO | WO 02/069356 A1 | 9/2002 |

OTHER PUBLICATIONS

Block, Thomas, "Neue Materialien für die Magnetoelektronik: Heusler- und Halb-Heusler-Phasen" 2002 Mainz, pp. 159-177.
Barth, Dr. Stefan, "LSMO-Siebdruckschichten für CMR-Anwendungen" Mar. 2001, pp. 1-7.
Mengel, Stefan, "XMR-Technologien" [XMR-Technologies], Aug. 1997, pp. 11-43.

* cited by examiner

*Primary Examiner*—Ernest Karlsen
(74) *Attorney, Agent, or Firm*—Harness, Dickey & Pierce

(57) ABSTRACT

The apparatus for measurement of a current which is flowing in an axially elongated electrical conductor at a first electrical potential. The apparatus contains at least one associated sensor element associated with the conductor that is electrically isolated from it at a second electrical potential different from the first electrical potential of the electrical conductor, and having magnetoresistive characteristics. The sensor element is intended to form a loop which is magnetically closed around the conductor in the circumferential direction, with the resistance value being tapped off at axially opposite ends. Its magnetoresistive part is preferably composed of a non-metallic powder composite material with a high magnetoresistive effect.

19 Claims, 2 Drawing Sheets

APPARATUS FOR CURRENT MEASUREMENT

The present application hereby claims priority under 35 U.S.C. §119 on German patent application numbers DE 10 2004 014 212.2 filed Mar. 23, 2004 and DE 10 2004 062 474.7 filed on Dec. 23, 2004, the entire contents of which are hereby incorporated herein by reference.

FIELD OF THE INVENTION

The invention generally relates to an apparatus for measurement of a conductor current which is flowing in an axially elongated electrical conductor at a first electrical potential. Preferably, it relates to one having at least one sensor element which is associated with the conductor that is electrically isolated from it and has magnetoresistive characteristics, and having a device for tapping off the resistance value, which is dependent on the magnetic field of the current, across the element and for further processing of this value.

BACKGROUND OF THE INVENTION

An apparatus for measurement of a conductor current which is flowing in an axially elongated electrical conductor at a first electrical potential is generally disclosed in WO 95/09447 A.

Current measurement is used throughout the entire field of electrical power transmission, power management, control engineering and automation engineering. Since this frequently relates to a safety-relevant function, the current transformer that is used must be protected against external disturbance influences and fields. If low-cost and geometrically simple solutions are available, the current monitoring can intervene at an early stage, and can prevent damage, at a large number of points.

Nowadays, various solutions exist for current detection and measurement, for example with measurement resistors (shunts) being used combined with opto couplers, as well as current transformers, Hall elements, field plates, sensor systems using magnetoresistive material, and fiber-optic current measurement devices. However, many of the current sensors have a limited operating range and are limited, for example by alternating-current measurement since they are based on inductive principles, or cannot be integrated. One problem of the magnetic solutions which have been mentioned, in which the field of a conductor through which a current passes is measured, results from the fact that a disturbance field frequently acts highly directly, and shielding devices or graded and/or compensation methods must be used all the time.

The WO-A document which was cited initially discloses a current measurement apparatus which has at least one sensor element which surrounds a conductor through which current flows, in the form of an open ring. In this case, the open ring is formed by a multilayer system composed of metallic magnetoresistive material of the so-called AMR (Anisotropic Magneto Resistance) type. The magnetoresistive material is made contact with at the adjacent ends of this ring, which form a slot, in order to tap off the resistance value. A sensor element such as this may be connected to further elements which are not sensitive to magnetic fields, to form a bridge. The magnetoresistive materials which are used can be produced in curved shapes, such as the slotted annulus that is required, only with considerable effort.

DE 39 29 452 A1 likewise discloses a current measurement apparatus. The known apparatus contains a magnetic field ring sensor, which has a substrate with a central circular opening for an electrical conductor to pass through. A large number of individual sensor elements of the so-called barber pole type are arranged around the circular opening and each have strips which are deposited on the substrate using a thin-film technique, are aligned radially, are composed of magnetoresistive material and have electrical conductor parts running at an angle to them. The individual sensor elements, which are considerably separated from one another in the circumferential direction, are electrically connected in series. The design of this known apparatus is highly complex.

SUMMARY OF THE INVENTION

An object of an embodiment of the present invention is to refine the known current measurement apparatuses so as to simplify their design for adequate sensitivity.

According to an embodiment of the invention, at least one sensor element which is formed from magnetoresistive material is accordingly intended to form a loop which is magnetically closed around the conductor in the circumferential direction and has a predetermined axial extent, with the resistance value being intended to be tapped off at axially opposite ends of the sensor element.

This refinement of the current measurement apparatus advantageously makes it possible to design its at least one current sensor element in a simple manner: A loop which is magnetically virtually completely closed, in particular in the form of a ring or sleeve, and composed of metallic or, in particular, non-metallic magnetoresistive material is located in the magnetic field circuit of the current-carrying electrical conductor, and is conductively isolated from it by a thin insulation layer. This loop has a predetermined, pronouncedly axial extent, which is considerably greater than the thickness of the magnetoresistive thin films, and, in particular, is at least 1 mm.

In consequence, a closed magnetic flux can be produced in the magnetically closed loop, highly effectively making use of the rotationally symmetrical field of the conductor for magnetization of the magnetoresistive material. Thus, it can achieve a correspondingly high magnetoresistive effect or output signal without any need for special additional electrically conductive elements as in the case of magnetoresistive sensor elements of the barber pole type. The influence of homogeneously superimposed fields such as disturbance fields is in this case advantageously small. Both the manufacture of appropriate loops and the process of making contact with them at the axially opposite ends of their magnetoresistive material are particularly simple.

Advantageous refinements of the current measurement apparatus according to the invention are described in the example embodiments. Accordingly, the following features can additionally also be provided for the current measurement apparatus:

a material which indicates an AMR effect can be provided as a metallic material for the magnetoresistive part of the sensor element, in which case the magnetoresistive part can be designed using known methods.

instead of this, a powder material with a high magnetoresistive effect can preferably be used as a non-metallic material. In this context, the expression a high magnetoresistive effect refers to a value defined in the normal manner of at least 3% at room temperature. In this case, a powder composite material may advantageously be chosen as the powder material, which expression includes a composition of at least two different materials in which a particle structure can still be found. The material can be produced and processed in a known manner. Composite materials such as these include, in particular, the so-called Colossal-Magneto-Resistance (CMR)—or Tunnel-Magneto-Resistance (TMR) materials (see, for example, the brochure "XMR-Technologien (Technologieanaly-se-Magnetis-mus Band 2)" [XMR technologies (Technological analysis—magnetism Volume 2] from the VDI-Technologiezentrum "Physikalische Technologien" [Physical Technologies VDI Technology Center], Düsseldorf, (DE), 1997, pages 26 to 27 and 37 to 43). These advantageously allow any desired 3D shape. Since, furthermore, these materials have a soft-magnetic behavior, the magnetic flux which is produced can be carried very well by them.

one powder composite material which is particularly suitable contains particles composed of at least one Heusler or half-Heusler phase, to which a small proportion of at least one oxide material, preferably less than 25% by volume, is added.

instead of this, the powder material may contain particles composed of at least one manganese perovskite phase to which, if required, a small proportion of an organic material is added in order to form a composite material. The added proportion in the powder composite material may also in this case advantageously be less than 25% by volume. These materials make it possible to form highly magnetoresistive composite materials with adequate flexibility.

the current measurement apparatus may, of course, have two or more sensor elements, which are arranged one behind the other in the axial longitudinal direction of the conductor. In this case, the preferred directions (which point in the axial longitudinal direction) of the magnetization can advantageously be in opposite directions from one element to the next. Elements such as these can then easily be connected to form a full bridge or partial bridge. It is thus possible, for example, to compensate for temperature influences on the individual sensor elements to a major extent.

furthermore or instead of this, the at least one sensor element can be subdivided into two or more partial elements, in particular with the partial elements being arranged distributed in the circumferential direction around the conductor. A design such as this on the one hand makes it easier to fit the element around an electrical conductor. On the other hand, a full bridge or partial bridge can also be formed in this case, in which case the preferred directions of the magnetization of adjacent partial elements should likewise be set such that they are aligned parallel and in opposite directions.

furthermore, it can be regarded as being particularly advantageous for the at least one sensor element to be provided with a high permeability shielding sheath. The combination of the sensor element with a sheath such as this allows very effective shielding. Furthermore, this results in a current sensor which, for example, can easily be integrated in the insulation of a power cable.

BRIEF DESCRIPTION OF THE DRAWINGS

Further advantageous refinements of the current measurement apparatus according to the invention are described in the example embodiments below, and are illustrated in the drawings.

The invention will be explained in more detail in the following text using preferred exemplary embodiments of measurement apparatuses and with reference to the drawings. In the figures of the drawing, which are in the form of slightly schematic illustrations.

In this case, corresponding parts in the figures are in each case provided with the same reference symbols.

DETAILED DESCRIPTION OF THE EXEMPLARY EMBODIMENTS

Figure 1:
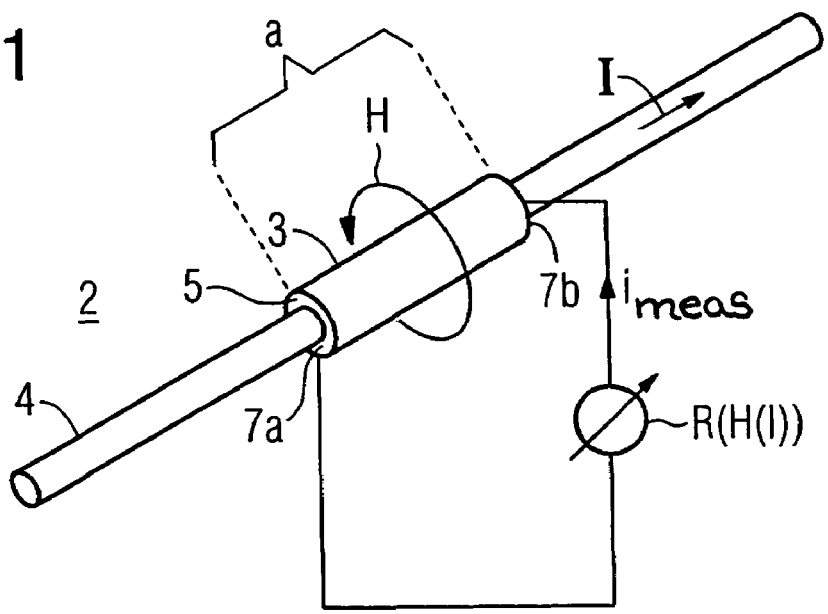
FIG. 1 shows an oblique view of a measurement apparatus such as this having a single sensor element.

The current measurement apparatus 2 which is illustrated according to an embodiment of the invention, as illustrated in FIG. 1, has a sensor element 3 which surrounds an electrical conductor 4 through which direct current or alternating current I is flowing. In this case, the sensor element 3 is conductively isolated from the electrical conductor 4, for example being isolated from it by way of a thin insulation layer 5.

The sensor element is in particular in the form of a ring or sleeve, which represents a sheath which magnetically completely surrounds the electrical conductor 4 in the circumferential direction. In this case, the sensor element has a predetermined extent which is pronounced in the axial direction and shall be at least 1 mm. At least a substantial proportion of it is composed of a magnetoresistive material.

Fundamentally, all materials which are known per se with an XMR effect (see the cited brochure "XMR Technologies", pages 11 to 43) may be used for this purpose. In this case, the magnetoresistive part of the sensor element 3 may be formed from a metallic or non-metallic material using known methods. By way of example, a metallic thick-film or in particular thin film composed of an AMR material may thus be provided.

A non-metallic powder material is particularly suitable, in particular a powder composite material which indicates a high magnetoresistive effect of at least 3% (based on the normal definition). The material can be formed using, in particular, methods which are known from powder processing technology, in which case a carrier can also be applied. It is thus possible, for example, to use sintering, molding, spraying/injection, thick film or thin film, slip/paste or print methods.

A non-metallic powder composite material with a high CMR or TMR effect has been chosen for the exemplary embodiments in the following text. This material has particles or powder composed of at least one magnetoresistive, or possibly even non-magnetoresistive, material, with the proportion of this material advantageously being chosen to be very high and, for example, being more than 75% by volume. The remaining proportion is made up from at least one further material, in particular such as an oxide or organic material, in which case the magnetoresistive characteristics may possibly be produced only with this additive.

One preferred example of a highly magnetoresistive powder composite material such as this in particular uses powder particles with Heusler or half-Heusler phases as the main component. This is primarily because it is known that powder composite materials with a high magnetoresistive TMR effect can be produced using powders composed of these initially virtually non-magnetoresistive materials, in conjunction with a small amount of an oxide material which acts as a grain boundary form means (see, for example, dissertation by Thomas Block: "Neue Materialien für die Magnetoelektronik: Heusler-und Halb-Heusler-Phasen" [Novel materials for magneto electronics: Heusler and half-Heusler phases], Johannes Guttenberg University, Mainz, 2000, in particular the section entitled "Komposit-Material" [composite material], on pages 159 to 177). In this case, the following alloys, in particular, may be used:

$CoV_{1-x}Mn_xSb$
$Co_2CrAl$
$Co_2Cr_{0,6}Fe_{0,4}Al$
$Co_2Cr_{0,6}Fe_{0,4}Ga$

In this case, individual components of the abovementioned materials may be substituted in a known manner by other components in which case two or more substituents may also replace one component.

Non-magnetic materials, in particular oxides such as $Cr_2O_3$ or $Al_2O_3$, may be used as additional materials for the abovementioned main component powders. The important factor in this case is that these materials form grain boundaries in the composite material, which are a precondition for a TMR effect.

Manganese Perovskite materials are also particularly suitable owing to the CMR effect which occurs in this substance group. Corresponding known Perovskites are in particular chosen from the $Ln_{1-x}A_xMnO_{3+d}$ system, an alkaline earth metal being chosen as the A component (see, for example, DE 43 10 318 C2). The structure and the physical characteristics of such Perovskites are governed to a major extent not only by the composition but also by the stoichiometry of the oxygen index d, which can be set in a known manner by suitable choice of the temperature and of the oxygen partial pressure.

It is also known that highly magnetoresistive elements with a good shaping capability can be produced using these materials by adding small proportions of organic material, in particular such as polymer materials (see, for example, the article by S. Barth: "LSMO-Siebdruckschichten für CMR-Anwendungen" [LSMO screen-printing layers for CMR applications] during the symposium entitled "Magnetoresistive Sensoren VI: Grundlagen, Herstellung, Anwendung", [Magnetoresistive sensors, VI: Fundamentals, Production, Use], Wetzlar (DE), Mar. 13 and 14 2001). In this case as well, the added proportion is generally less than 25% by volume.

The insulated conductor 4 through which current flows produces a magnetic field of strength of H which leads in the tubular, magnetoresistive sleeve of the sensor element 3 to a resistance value R which depends on the field strength H and on the current I. This resistance value is in this case advantageously tapped off at the axially opposite ends 7a and 7b of the sensor element 3 or of its magnetoresistive sleeve, by passing predetermined measurement current $i_{meas}$ in the axial direction through the magnetoresistive material of the sensor element. The measurement voltage, which is correlated to the resistance value, is then processed further in a known manner.

Figure 2:
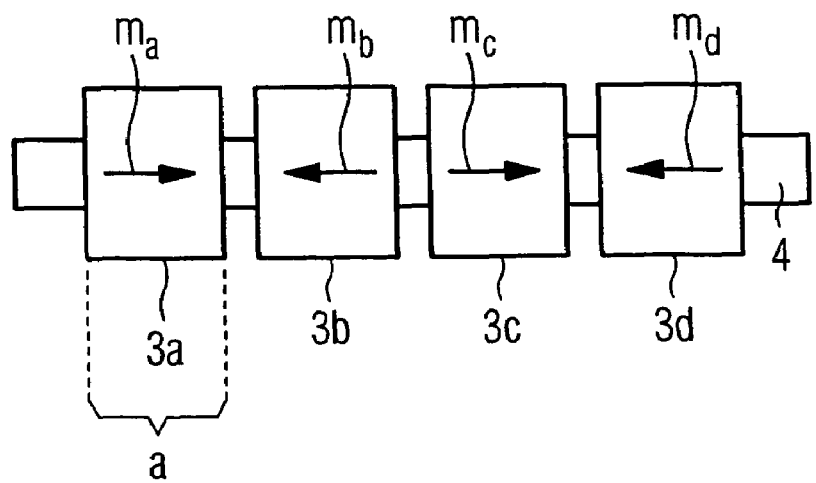
FIG. 2 shows a side view of another embodiment of a measurement apparatus having a half bridge or full bridge composed of two or more connected sensor elements.

As is shown in the illustration in FIG. 2, a current measurement apparatus 10 may, of course, also have two or more sensor elements 3a to 3d, which are arranged one behind the other in the axial direction of the conductor 4. These elements can advantageously be connected to form a half bridge or full bridge. For this purpose, preferred directions of the magnetizations $m_a$ to $m_d$ in the individual elements are preferably set such that they point in the longitudinal direction and are at the same time in opposite directions from one element to the next.

The embodiments shown in FIGS. 1 and 2 have been based on the assumption that the at least one sensor element has at least one sleeve, which is completely closed in the circumferential direction and is composed of highly magnetoresistive composite material. However, since all that matters is to form a closed magnetic ring around the electrical conductor in the circumferential direction, the sleeve or ring which is used can if required also be subdivided into partial elements which are longitudinally electrically insulated but are electrically connected to one another at the ends.

Figure 3:
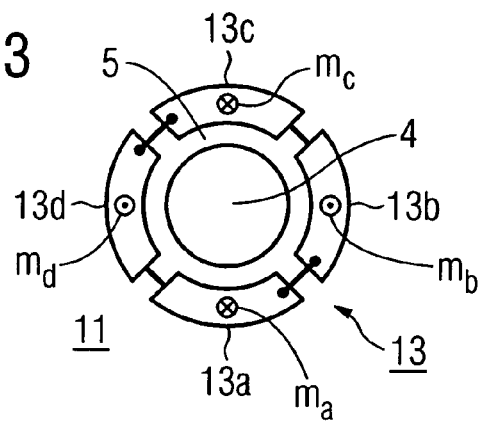
FIG. 3 shows a cross-sectional view of a further embodiment of a measurement apparatus having a full bridge composed of sensor partial elements.

FIG. 3 shows a corresponding embodiment of a current measurement apparatus 11 having a sensor element 13 which is formed from four quarter shell elements 13a to 13d which are located distributed alongside one another in the circumferential direction. In this case, the air gaps between adjacent partial elements should be kept as small as possible. In this case as well, the partial elements can be connected to form a full bridge in order to compensate for temperature influences and disturbance fields aligned transversely with respect to the conductor.

In this case, the preferred directions (which point in the longitudinal direction) of the magnetizations $m_a$ to $m_d$ should be in opposite directions in the circumferential direction from one partial element to the next. Partial bridges can also be formed by way of partial elements such as these. If required, it is possible to combine the individual sensor elements, as shown in FIG. 2, with assembled sensor elements 13 as shown in FIG. 3.

Figure 4:
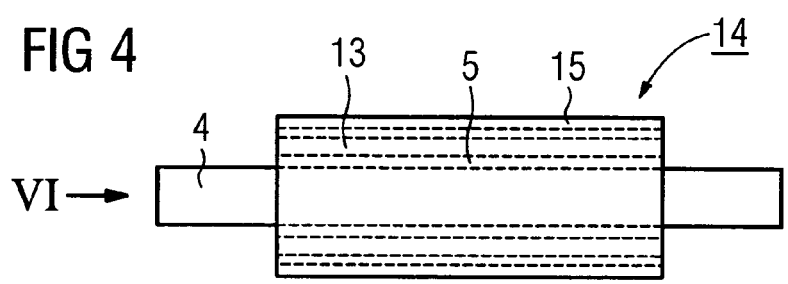
FIGS. 4 and 5 show side views of the measurement apparatuses shown in FIG. 1 and FIG. 2, respectively, each with a shielding sheath.
Figure 5:
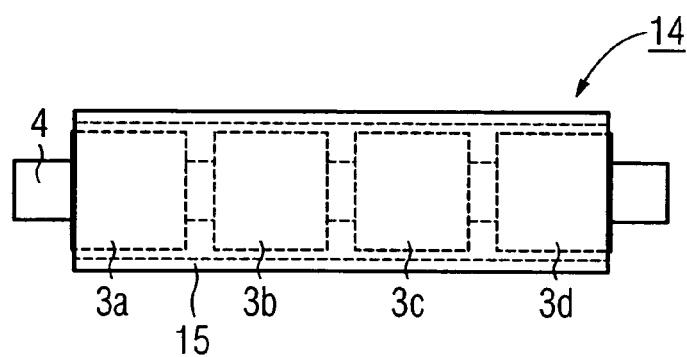

As can be seen from FIGS. 4 and 5, the embodiments shown in FIGS. 1 to 3 in the case of a current measurement apparatus 14 or 14' may additionally be surrounded by a shielding sheath 15 in order to effectively suppress disturbance fields. In this case, a sensor element 13 as shown in FIG. 3 is assumed to be provided for the current measurement apparatus 14 shown in FIG. 4, while the current measurement apparatus 14' in FIG. 5 is equipped with four sensor elements 3a and 3d as shown in FIG. 2. The shielding sheath 15 is at a distance from and is isolated from the magnetoresistive parts which are surrounded by it. Those parts which are in each case concealed by the shielding sheath 15 in the side views shown in FIGS. 4 and 5 are indicated by dashed lines.

Figure 6:
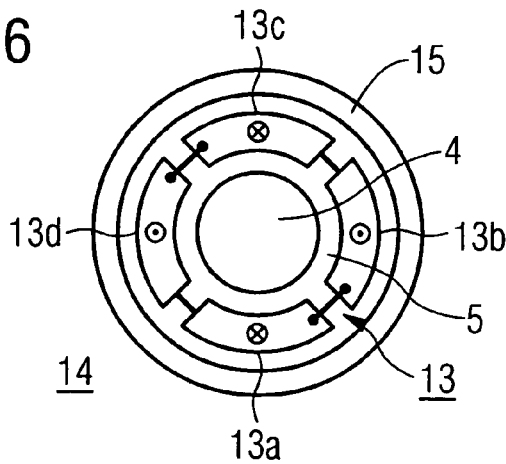
FIG. 6 shows an end view of the measurement apparatus shown in FIG. 4.

FIG. 6 shows the current measurement apparatus 14 from FIG. 4 in a view equivalent to a plan view of one end of the apparatus.

The following text provides two estimates of the disturbance influence of homogeneously superimposed fields on a magnetoresistive ring or a sleeve based on the assumption of a linear magnetoresistive effect. In this case, reference should be made to the embodiments of current measurement apparatuses shown in FIGS. 1 and 2:

1) If the sleeve 3 is magnetized in a rotationally symmetrical form by a current flow I, a uniform magnetoresistive effect is produced throughout the entire annular area. If the conductor 4 with the magnetoresistive sleeve 3 is located in a homogeneous disturbance field, the resultant field is attenuated on one side of the sleeve by superimposition of the conductor field H and the disturbance field. On the opposite side of the conductor, and thus of the sleeve, the field is, however, increased for the same reasons. Owing to the symmetry of the arrangement, an equivalent circuit with two parallel-connected resistors $R_0$ can be assumed for the sleeve. Therefore, this results in the following overall resistance R based on the relationship:

$$\frac{1}{R} = \frac{1}{R_0} + \frac{1}{R_0} = \frac{2}{R_0}, \text{ that is to say } R = \frac{R_0}{2}.$$

2) The symmetry of the rotationally symmetrical magnetization with a closed flux is interrupted by a homogeneously superimposed disturbance field. A different magnetoresistive effect then occurs in opposite halves of the sleeve 3. A simplified equivalent circuit can thus be produced for the sleeve with two parallel-connected resistors $(R_0+R_{st})$, where $R_{st}$ is intended to represent the resistance connected to the superimposed disturbance field. This then results in the following relationship:

$$\frac{1}{R} = \frac{1}{R_0+R_{st}} + \frac{1}{R_0-R_{st}} = \frac{2R_0}{R_0^2-R_{st}^2},$$

that is to say $$R = \frac{R_0}{2} - \left[\frac{1}{2}\frac{R_{st}^2}{R_0}\right].$$

In this situation, the linear disturbance in the magnetization of the two parallel-connected paths is admittedly not compensated for completely as in case 1) of a series arrangement; however, it is evident in the magnetoresistive effect only as a second-order disturbance, and is therefore of secondary importance.

However, it is evident from both estimates that the use according to the invention of a loop which is magnetically completely closed in the circumferential direction as a sensor element in the rotationally symmetrical field of the conductor results in disturbance fields having only a relatively minor influence. The current measurement apparatus designed according to the invention thus provides a universal sensor solution, which can easily be integrated, for monitoring and detection of both DC and AC currents.

Exemplary embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. An apparatus for measurement of a conductor current which is flowing in an axially elongated electrical conductor, comprising:

at least one sensor element at least partially encircling the conductor that is electrically isolated from the conductor and has magnetoresistive characteristics; and means for tapping off a resistance value, the resistance value depending on the magnetic field of the current flowing through the conductor, across the at least one sensor element and for further processing of the resistance value, wherein the at least one sensor element which is formed from magnetoresistive material forms a loop which is magnetically closed around the conductor in the circumferential direction and has a predetermined axial extent, wherein the resistance value is tapped off axially at opposite ends of the sensor element by passing measurement current in the axial direction through the magnetoresistive material of the sensor element, wherein the magnetoresistive material is a non-metallic material including a powder composite material with a high magnetoresistive effect, and wherein the powder composite material contains particles compose of at least one Heusler or half-Heusler phase to which a small proportion of at least one oxide material is added.

2. The apparatus as claimed in claim 1, wherein the axial extent is at least 1 mm.

3. The apparatus as claimed in claim 1, wherein the metallic material is of the AMR type.

4. The apparatus as claimed in claim 1, wherein the proportion of the oxide material in the powder composite material is less than 25% by volume.

5. The apparatus as claimed in claim 1, wherein a chromium or aluminum oxide is chosen as the oxide material.

6. The apparatus as claimed in claim 1, wherein the powder material contains particles composed of at least one manganese Perovskite phase.

7. The apparatus as claimed in claim 6, wherein the powder material is a composite material to which a small proportion of an organic material is added.

8. The apparatus as claimed in claim 7, wherein the proportion of the organic material in the powder composite material is less than 25% by volume.

9. The apparatus as claimed in claim 7, wherein a polymer is chosen as the organic material.

10. The apparatus as claimed in claim 1, wherein the magnetically closed loop is formed by the sensor element being in the form of a ring or sleeve.

11. The apparatus as claimed in claim 1, wherein at least two sensor elements are arranged one behind the other in the axial longitudinal direction of the conductor.

12. The apparatus as claimed in claim 11, wherein the sensor elements are connected to form at least one of a full bridge and a partial bridge, with the preferred directions of the magnetizations being in opposite directions from one element to the next.

13. The apparatus as claimed in claim 1, wherein the at least one sensor element is subdivided into at least two partial elements, arranged distributed in the circumferential direction around the conductor.

14. The apparatus as claimed in claim 12, wherein the partial elements are connected to form at least one of a full bridge and a partial bridge, with the preferred directions of the magnetizations being in opposite directions from one partial element to the next.

15. The apparatus as claimed in claim 1, wherein the at least one sensor element is provided with a high-permeability shielding sleeve.

16. The apparatus as claimed in claim 4, wherein a chromium or aluminum oxide is chosen as the oxide material.

17. The apparatus as claimed in claim 8, wherein a polymer is chosen as the organic material.

18. The apparatus as claimed in claim 1, wherein the at least one sensor element is fixedly connected to the conductor.

19. The apparatus as claims in claim 18, wherein the an insulation layer is interposed between the at least one sensor element and the conductor.

* * * * *